United States Patent [19]
Hulburd et al.

[11] Patent Number: 5,263,536
[45] Date of Patent: Nov. 23, 1993

[54] MINIATURE HEAT EXCHANGER

[75] Inventors: William G. Hulburd, San Diego; Theodore A. Picoraro, El Cajon, both of Calif.

[73] Assignee: Thermo Electron Technologies Corp., San Diego, Calif.

[21] Appl. No.: 732,919

[22] Filed: Jul. 19, 1991

[51] Int. Cl.⁵ .................... F28F 13/06; H01L 23/473
[52] U.S. Cl. .................................. 165/80.4; 165/908; 165/104.33; 361/699; 361/701
[58] Field of Search ............... 165/80.4, 908, 104.33; 361/385

[56] References Cited
U.S. PATENT DOCUMENTS

| | | |
|---|---|---|
| 4,494,171 | 1/1985 | Bland et al. ........................ 165/908 |
| 4,561,040 | 12/1985 | Eastman et al. ................... 165/80.4 |
| 4,791,983 | 12/1988 | Nicol et al. ........................ 165/80.4 |

Primary Examiner—Albert W. Davis, Jr.
Attorney, Agent, or Firm—John R. Ross

[57] ABSTRACT

A miniature heat exchanger. A small housing provides a heat exchanger surface, contains a spray shower head. A cooling fluid enters through a base plate and is sprayed through holes in the shower head on to the underside of the cooling surface. The heated coolant exists through exit holes in the nozzle and out a coolant outlet in the base plate. The device may also be used as a heater to provide temperature control to localized areas or large surfaces.

4 Claims, 3 Drawing Sheets

AA

BB

CC

MINIATURE HEAT EXCHANGER

This invention relates to miniature heat exchanger devices and in particular to miniature liquid cooled devices.

BACKGROUND OF THE INVENTION

Since the beginning of the electronic industry there has been a need to cool small electronic components. More recently, with the advent of high power lasers there has developed a need to cool mirrors used to direct high power laser beams. Some of these mirrors are segmented mirrors comprised of small mirrors with dimensions in the centimeter or millimeter range. Generally these components are cooled with air currents produced by electric fans. However, in many instances it is not feasible to accomplish the required cooling with air.

There had been some attempts to provide the needed cooling with thermo electric coolers but these devices are relatively expensive and in many cases are not satisfactory. Some small liquid heat exchangers have been produced. However, these devices have been complicated, difficult to fabricate and expensive such as silicon microchannel plate devices.

SUMMARY OF THE INVENTION

The present invention provides a miniature heat exchanger. A small housing provides a heat exchanger surface, contains a spray shower head. A cooling fluid enters through a base plate and is sprayed through holes in the shower head on to the underside of the cooling surface. The heated coolant exists through exit holes in the nozzle and out a coolant outlet in the base plate. The device may also be used as a heater to provide temperature control to localized areas or large surfaces.

DETAILED DESCRIPTION OF PREFERRED EMBODIMENTS

Figure 5:
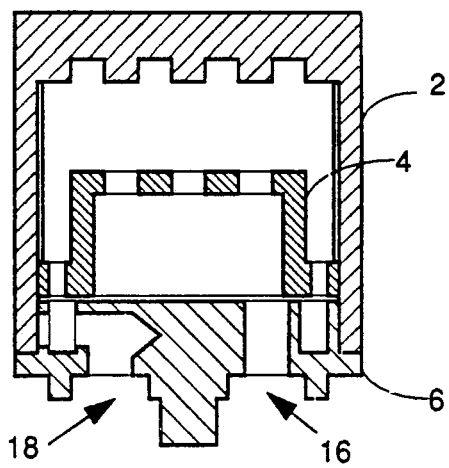
FIG. 5 shows the parts assembled.
Figure 6:
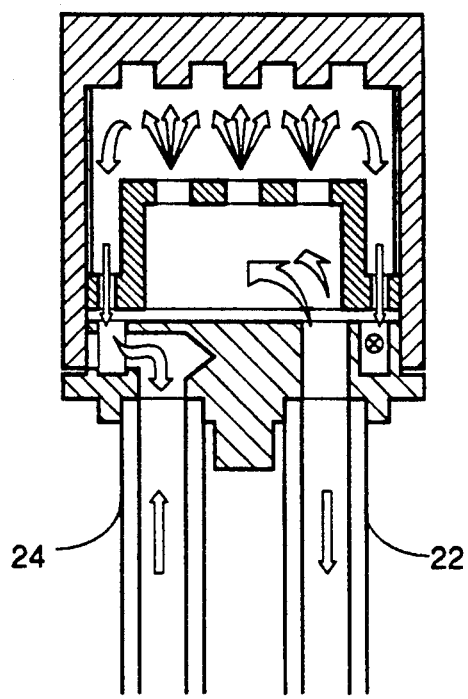
FIG. 6 shows the inlet and outlet tubes in place.
Figure 8:
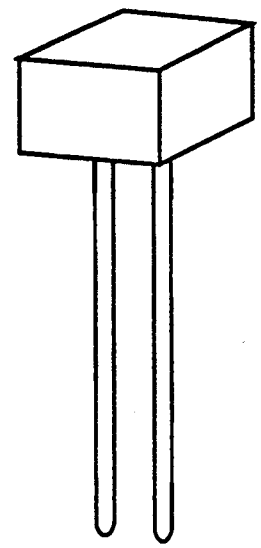
FIG. 8 shows a perspective view.

One preferred embodiment of a miniature cooler made according to the teachings of the present invention can be described by reference FIGS. 1-7. The cooler is made from three basic parts shown in sections in FIG. 1. The three parts are the housing 2 milled from bar copper, the nozzle 4 machined from bar brass and the base plate 6 also milled from brass. The area of cooling surface 8 of miniature cooler is 1 square centimeter. By reference to FIG. 5 and FIG. 1 the reader can see how the three parts fit together. Nozzle 4 is held in place between ridge 10 of housing 2 and the upper surface 12 of base 6. The joining of the three parts is extremely simple. A layer of 95/5 alloy solder paste manufactured by Lake Chemical Company is placed around the base 6 at notch 14 and the parts are fitted together as shown in FIG. 5. Additional 95/5 solder parts is placed around the circumference of slots 16 and 18. Outlet tubes also brass are fitted into slots 16 and 18 respectively as shown in FIG. 6. The assembled unit is then placed in a holding fixture and the unit and the holding fixture is paced in an oven at 550 degrees for about 8 minutes. The heated solder seals the unit together. The complete unit is shown in perspective in FIG. 8.

Figure 2:
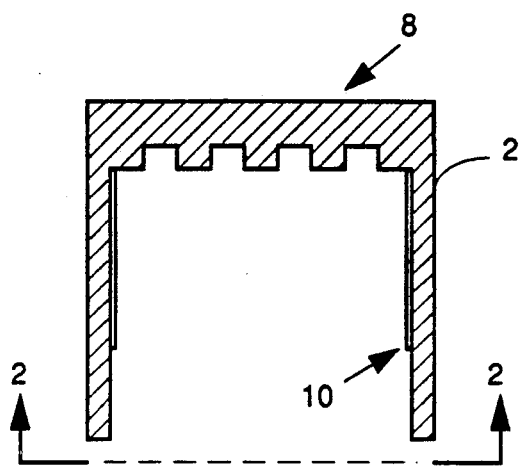
FIG. 2 shows the underside of the cooling surface.
Figure 2:
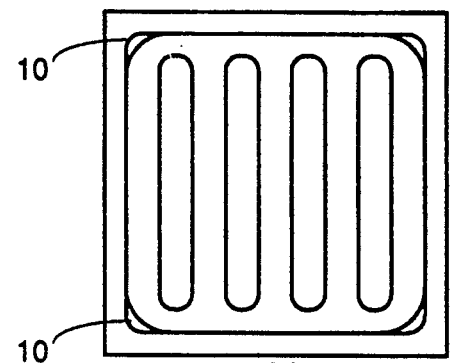
Figure 1:
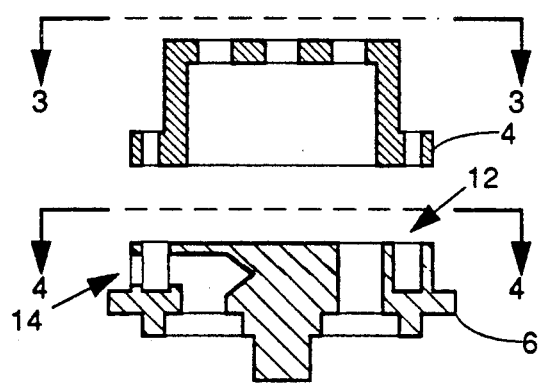
FIG. 1 is a section view of the three principal parts of the present invention.
Figure 3:
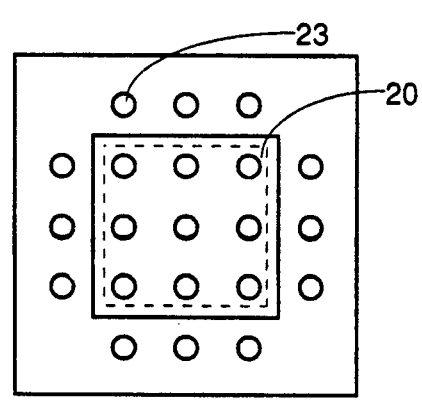
FIG. 3 shows the top of the shower head.
Figure 4:
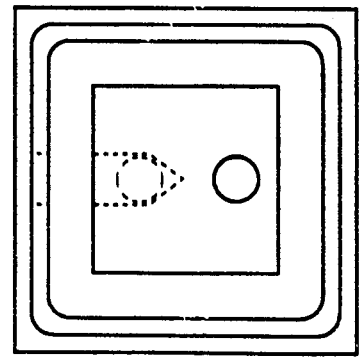
FIG. 4 shows the top of the base.

The inside of the top surface of housing 2 is slotted to increase heat transfer by increasing surface area as shown in FIG. 1 and view AA shown in FIG. 2. FIG. 3 is a top view BB of nozzle 4 showing nine spray holes 20 and nine exit holes 23. The spray holes 20 are 0.8 mm diameter. The size of these holes are chosen to define the flow rate of cooling or heating water through the heat exchanger. FIG. 4 is view CC and shows the top view of base 6. The tubes have an OD of 3 mm and ID of 2 mm. At a pressure of 15 psi, the water flow rate through the cooler is 500 milliliters per minute with the spray and exit holes having the dimensions as set forth above.

All orifices are kept relatively large so that low pressures may be used and stoppage to particulate matter is significantly reduced compared to other methods such as microchannel plate devices.

USES

Figure 9:
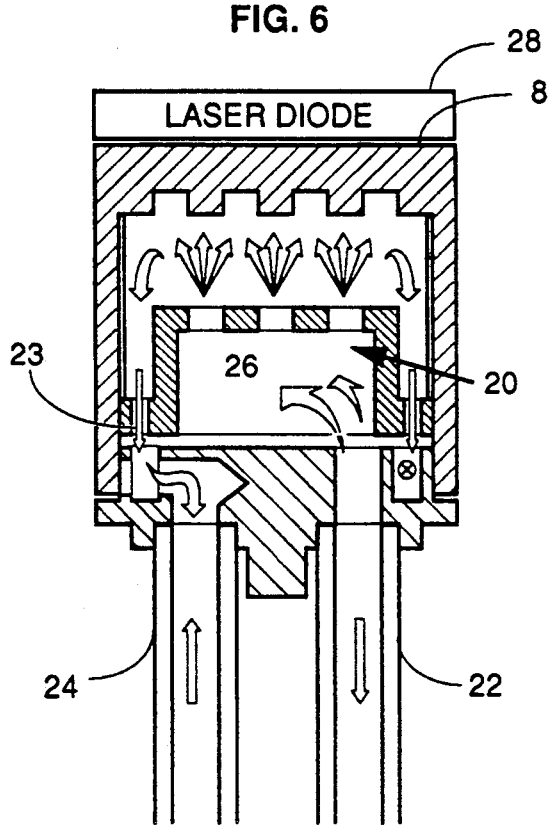
FIG. 9 shows an assembled unit cooling a laser diode.
Figure 7:
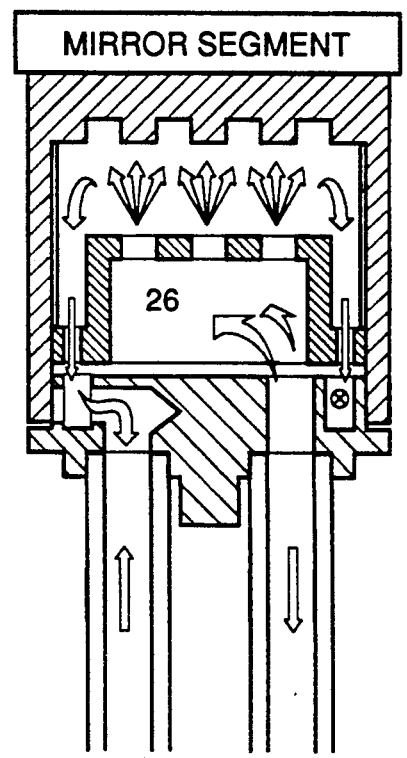
FIG. 7 shows an assembled unit cooling a mirror segment.
Figure 10:
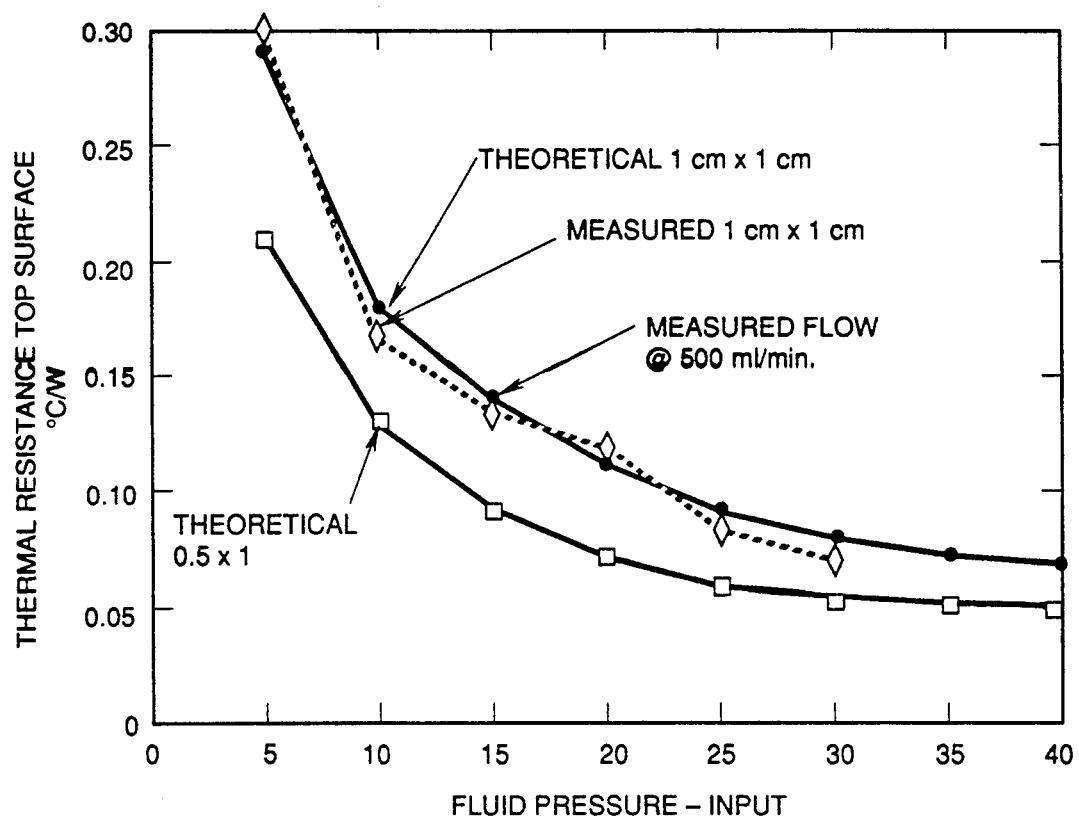
FIG. 10 shows cooling curves.

The embodiment described above has been used to cool laser mirror segments as indicated in FIG. 7 and laser diodes as indicated in FIG. 9. The part to be cooled is attached to the cooling surface of the miniature cooler with a high temperature epoxy or a low temperature solder. For the epoxy, we prefer Eccobond 285 produced by Emerson and Coming Inc. a subsidiary of WR Grace Co. The flow stream is as shown in FIG. 9. Water enters through tube 22, passes into reservoir 26 and sprays through spray holes 20 onto the bottom side of cooling surface 8 to remove heat produced by laser diode 28. The warmed water passes out through exit holes 23 and exit tubes 24. FIG. 10 shows the calculated and performance curves for this 1 cm × 1 cm embodiment FIG. 10 also shows the calculated performance curve for our 0.5 cm × 1 cm model. At a fluid pressure of 20 psi the thermal resistance is about 0.1° c/w.

For a 1 $cm^2$ diode producing 200 watts the hot surface would be about 20° C. greater than the cooling water temperature. The flow rate of the cooling water at a 20 psi pressure difference would be about 500 ml/min and the temperature rise would be about 25° C.

Applicants have fabricated several miniature following the teachings of this invention. Practical sizes could be as small as about ¼ $cm^2$ to about 16 $cm^2$.

While the above description describes specific embodiments of the present invention, the reader should not construe these as limitations on the scope of the invention but merely as examples. Accordingly, the reader should determine the scope of the invention by the appended claims and their legal equivalent.

We claim:

1. A miniature coaxial mounted heat exchanger for removing or providing heat with a fluid, said heat exchanger being comprised of:
   a. a housing defining a cooling surface of less than 16 $cm^2$
   b. a base plate machined from a single piece of metal comprising a liquid inlet and a liquid outlet, and c. a nozzle machined from a single piece of metal contained within said housing comprised of a plurality of spray holes and a plurality of exit holes, said base plate being soldered to said housing so as to form a sealed unit except for said coolant inlet and said coolant outlet, and said base plate, said nozzle and said housing being arranged to permit said fluid coolant to flow through said coolant inlet through said spay holes in said nozzle to impinge on the underside of said cooling surface and the flow out said exit holes in said nozzle and out said coolant outlet.

2. A heat exchanger as in claim 1 and further comprising a coolant inlet tube and a coolant outlet tube said tubes being soldered to said base plate to direct liquid into and out of said heat exchanger.

3. A heat exchanger as in claim 1 wherein said housing is made of copper.

4. A heat exchanger as in claim 1 wherein said nozzle is clamped in place between a surface of said base plate and a ridge on said housing.

* * * * *